(12) United States Patent
Yang et al.

(10) Patent No.: US 8,169,077 B2
(45) Date of Patent: May 1, 2012

(54) DIELECTRIC INTERCONNECT STRUCTURES AND METHODS FOR FORMING THE SAME

(75) Inventors: Chih-Chao Yang, Poughkeepsie, NY (US); Louis C. Hsu, Fishkill, NY (US); Rajiv V. Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/185,759

(22) Filed: Aug. 4, 2008

(65) Prior Publication Data

US 2008/0290518 A1 Nov. 27, 2008

Related U.S. Application Data

(62) Division of application No. 11/390,390, filed on Mar. 27, 2006, now Pat. No. 7,435,674.

(51) Int. Cl.
*H01L 23/52* (2006.01)

(52) U.S. Cl. ........ 257/751; 257/753; 257/743; 257/774; 257/E23.141; 257/E21.575; 257/E21.597; 257/E21.627; 257/E21.641; 438/627; 438/643; 438/118; 438/644; 438/654

(58) Field of Classification Search ................ 257/751, 257/753, E23.141, 750, E21.575, E21.597, 257/E21.627, E21.641, 743, 774; 438/627, 438/643, 118, 644, 654
See application file for complete search history.

(56) References Cited

U.S. PATENT DOCUMENTS

| | | | |
|---|---|---|---|
| 5,221,449 A | 6/1993 | Colgan et al. | |
| 5,281,485 A | 1/1994 | Colgan et al. | |
| 5,904,565 A * | 5/1999 | Nguyen et al. | 438/687 |
| 5,930,669 A | 7/1999 | Uzoh | |
| 6,037,256 A | 3/2000 | Weinrich et al. | |
| 6,043,414 A | 3/2000 | Luzzi | |
| 6,291,885 B1 | 9/2001 | Cabral, Jr. et al. | |
| 6,350,353 B2 | 2/2002 | Gopalraja et al. | |
| 6,429,519 B1 | 8/2002 | Uzoh | |
| 6,437,440 B1 | 8/2002 | Cabral, Jr. et al. | |
| 6,445,070 B1 * | 9/2002 | Wang et al. | 257/751 |
| 6,656,841 B1 * | 12/2003 | Kim | 438/687 |

(Continued)

OTHER PUBLICATIONS

Oliver Chyan et al, "Electrodeposition of Copper Thin Film on Ruthenium A Potential Diffusion Barrier for Cu Interconnect", Journal of the Electrochemical Society, 150 (5), 2003, pp. C347-C350.

(Continued)

*Primary Examiner* — Marc Armand
(74) *Attorney, Agent, or Firm* — Brian Verminski; Hoffman Warnick LLC

(57) ABSTRACT

Dielectric interconnect structures and methods for forming the same are provided. Specifically, the present invention provides a dielectric interconnect structure having a noble metal layer (e.g., Ru, Ir, Rh, Pt, RuTa, and alloys of Ru, Ir, Rh, Pt, and RuTa) that is formed directly on a modified dielectric surface. In a typical embodiment, the modified dielectric surface is created by treating an exposed dielectric layer of the interconnect structure with a gaseous ion plasma (e.g., Ar, He, Ne, Xe, $N_2$, $H_2$, $NH_3$, and $N_2H_2$). Under the present invention, the noble metal layer could be formed directly on an optional glue layer that is maintained only on vertical surfaces of any trench or via formed in the exposed dielectric layer. In addition, the noble metal layer may or may not be provided along an interface between the via and an internal metal layer.

7 Claims, 15 Drawing Sheets

U.S. PATENT DOCUMENTS

| | | | |
|---|---|---|---|
| 6,686,662 B2* | 2/2004 | Merchant et al. | 257/751 |
| 6,699,769 B2 | 3/2004 | Song et al. | |
| 6,844,261 B2 | 1/2005 | Marsh et al. | |
| 6,861,355 B2 | 3/2005 | Marsh | |
| 6,939,803 B2* | 9/2005 | Marathe et al. | 438/667 |
| 7,071,558 B2* | 7/2006 | Hu | 257/751 |
| 7,253,109 B2 | 8/2007 | Ding et al. | |
| 7,435,674 B2 | 10/2008 | Yang et al. | |
| 2005/0142862 A1* | 6/2005 | Chun | 438/639 |
| 2006/0024953 A1* | 2/2006 | Papa Rao et al. | 438/629 |
| 2006/0131750 A1* | 6/2006 | Dubin et al. | 257/751 |
| 2006/0160362 A1* | 7/2006 | Huang et al. | 438/700 |
| 2007/0202689 A1* | 8/2007 | Choi et al. | 438/637 |

OTHER PUBLICATIONS

Raevskaya, et al., "The Effect of Nickel on Interaction in the Copper-Ruthenium System", JLCM: 132, 1987, pp. 237-241.

Yang et al., U.S. Appl. No. 11/390,390, filed Mar. 27, 2006, Office Action Summary-Restriction Requirement, Nov. 19, 2007, 4 pages.

Yang et al., U.S. Appl. No. 11/390,390, filed Mar. 27, 2006, Office Action Summary, Jan. 22, 2008, 9 pages.

Yang et al., U.S. Appl. No. 11/390,390, filed Mar. 27, 2006, Notice of Allowance and Fee(s) Due, Jun. 5, 2008, 6 pages.

U.S. Appl. No. 12/173,899, filed Jul. 16, 2008, Office Action dated Sep. 24, 2010.

David Nhu, PTO Notice of Allowance and Fees Due, U.S. Appl. No. 12/173,899, Date Mailed Jan. 25, 2011, 10 pages.

David Nhu, PTO Notice of Allowance and Fees Due, U.S. Appl. No. 12/173,899, Date Mailed May 4, 2011, 11 pages.

David Nhu, PTO Notice of Allowance and Fees Due, U.S. Appl. No. 12/173,899, Date Mailed Sep. 19, 2011, 9 pages.

* cited by examiner

| Interface Interested | Adhesion Energy (J/m²) |
|---|---|
| PVD Cu on Ru | > 20 |
| plated Cu on Ru | > 20 |
| Ru on TaN | > 20 |
| Ru on dense dielectric | < 3 |
| Ru on porous dielectric | < 3 |
| TaN on dense dielectric | > 6 |
| PVD Cu on Ta | > 20 |

FIG. 1

PRIOR ART

DIELECTRIC INTERCONNECT STRUCTURES AND METHODS FOR FORMING THE SAME

REFERENCE TO PRIOR APPLICATIONS

This application is a divisional application of U.S. patent application Ser. No. 11/390,390, filed on Mar. 27, 2006 now U.S. Pat. No. 7,435,674 and is also related to co-pending U.S. patent application Ser. No. 12/173,899, filed on Jul. 16, 2008, which is hereby incorporated by reference.

BACKGROUND OF THE INVENTION

1. Field of the Invention

In general, the present invention provides dielectric interconnect structures and methods for forming the same. Specifically, the present invention provides an interconnect structure having a noble metal layer that is formed directly on a modified dielectric surface for applications such as Back End of the Line (BEOL) applications.

2. Related Art

Recently, noble metals such as Ruthenium (Ru) have emerged as an alternative liner material for Copper (Cu) integration for multiple reasons. For example, Ru deposition can be done by both Chemical Vapor Deposition (CVD) and Atomic Layer Deposition (ALD) techniques. Moreover, Cu has good adhesion to Ru. In addition, a Ru—Cu system is thermodynamically stable and has been reported to be immiscible. Still yet, Ru does not oxidize easily and has a fairly low bulk resistivity. The low resistivity of Ru is an important feature for it to enable direct electroplating of Cu.

Some advantages of adopting noble metals for Cu interconnect applications include the following: (1) better technology extendibility vs. current Physical Vapor Deposition (PVD) Tantalum-Nitride (Ta(N)) technology; (2) conformal deposition from ALD and CVD; (3) capable for Cu direct plating; (4) better electrical performance; and (5) thinner liner layer results in more Cu volume. Unfortunately, despite excellent adhesion strength between Cu and Ru, experimental results revealed poor adhesion between the Ru to dielectric interface. It is likely that Ru, a noble metal, bonds weakly with Carbon (C) and Oxygen (O). This could be a fundamental problem with deposition of Ru directly onto a dielectric substrate. Because of the poor Ru/dielectric adhesion issue, wafer peeling problems were observed during Cu electroplating and CMP, thus inhibiting adoption of this metallization scheme into manufacturing. Referring now to FIG. 1, a table 10 of adhesion energy $(J/m^2)$ for various interfaces is depicted. As shown, PVD of Cu on Ru, plated Cu on Ru, Ru on TaN, and PVD of Cu on Ta all exhibit high adhesion energy (e.g., $>20 \, J/m^2$). However, noble metal to dielectric interfaces such as Ru on dense dielectric, and Ru on porous dielectric exhibit low adhesion energy (e.g., $<3 \, J/m^2$).

Heretofore, attempts have been made at solving the aforementioned noble metal to dielectric interface adhesion issue. Referring to FIGS. 2A and 2B, two such approaches are shown. Specifically, FIG. 2A shows a dielectric interconnect structure 26 having a noble metal layer 16 (e.g., Ta). However, in order to achieve sufficient adhesion, between noble metal layer 16 and exposed dielectric layer 14, a glue layer 12 was required at all noble metal to dielectric interfaces. This included both horizontal and vertical surfaces of trenches 20A-20B and via 22. Moreover, the dielectric interconnect structure 12 of FIG. 2A applied glue layer 12 along a horizontal interface 18 between via 22 and internal metal layer 24. FIG. 2B shows dielectric interconnect structure 26 in which glue layer 12 is similarly applied on all interfaces between noble metal layer 16 and exposed dielectric layer 14 (e.g., including both horizontal and vertical surfaces of trenches 20A-20B). However, dielectric interconnect structure 26 lacks glue layer 12 along interface 18 between via 22 and internal metal layer 24. The attempts shown in FIGS. 2A-2B both suffer from disadvantages including requiring glue layer 12 to be present along all noble metal to dielectric interfaces.

In view of the foregoing, there exists a need for a solution that solves at least one of the problems/disadvantages of the existing art.

SUMMARY OF THE INVENTION

In general, the present invention provides dielectric interconnect structures and methods for forming the same. Specifically, the present invention provides a dielectric interconnect structure having a noble metal layer (e.g., Ru, Ir, Rh, Pt, RuTa, and alloys of Ru, Ir, Rh, Pt, and RuTa) that is formed directly on a modified dielectric surface. In a typical embodiment, the modified dielectric surface is created by treating an exposed dielectric layer of the interconnect structure with a gaseous ion plasma (e.g., Ar, He, Ne, Xe, $N_2$, $H_2$, $NH_3$, and $N_2H_2$). Under the present invention, the noble metal layer could be formed directly on an optional glue layer that is maintained only on vertical surfaces of any trench or via formed in the exposed dielectric layer. In addition, the noble metal layer may or may not be provided along an interface between the via and an internal metal layer.

A first aspect of the present invention provides a method for fabricating a dielectric interconnect structure, comprising: providing an interconnect structure having an exposed dielectric layer; creating a modified dielectric surface by treating the exposed dielectric layer with a gaseous ion plasma; and depositing a noble metal layer directly on the modified dielectric surface.

A second aspect of the present invention provides a method for fabricating a dielectric interconnect structure, comprising: providing an interconnect structure having at least one trench in an exposed dielectric layer; depositing a glue layer on the exposed dielectric layer; removing the glue layer from at least one horizontal surface of the exposed dielectric layer by treating the glue layer with a first ion gaseous plasma; creating a modified dielectric surface by treating the exposed dielectric layer with a second gaseous ion plasma after removing the glue layer; and depositing a noble metal layer directly on the modified dielectric surface.

A third aspect of the present invention provides a dielectric interconnect structure, comprising: a modified dielectric surface formed on an exposed dielectric layer, the exposed dielectric layer having at least one trench; and a noble metal layer deposited directly on the modified dielectric surface.

A fourth aspect of the present invention provides a dielectric interconnect structure, comprising: an exposed dielectric layer having at least one trench and at least one via; a glue layer formed on vertical surfaces of the at least one trench and the at least one via; a modified dielectric surface formed on a horizontal surface of the exposed dielectric layer; and a noble metal layer deposited directly on the modified dielectric surface and the glue layer.

Therefore, the present invention provides dielectric interconnect structures and methods for forming the same.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 1 shows a table of adhesion energy (J/m$^2$) measurements for various interfaces according to the prior art.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 2B:
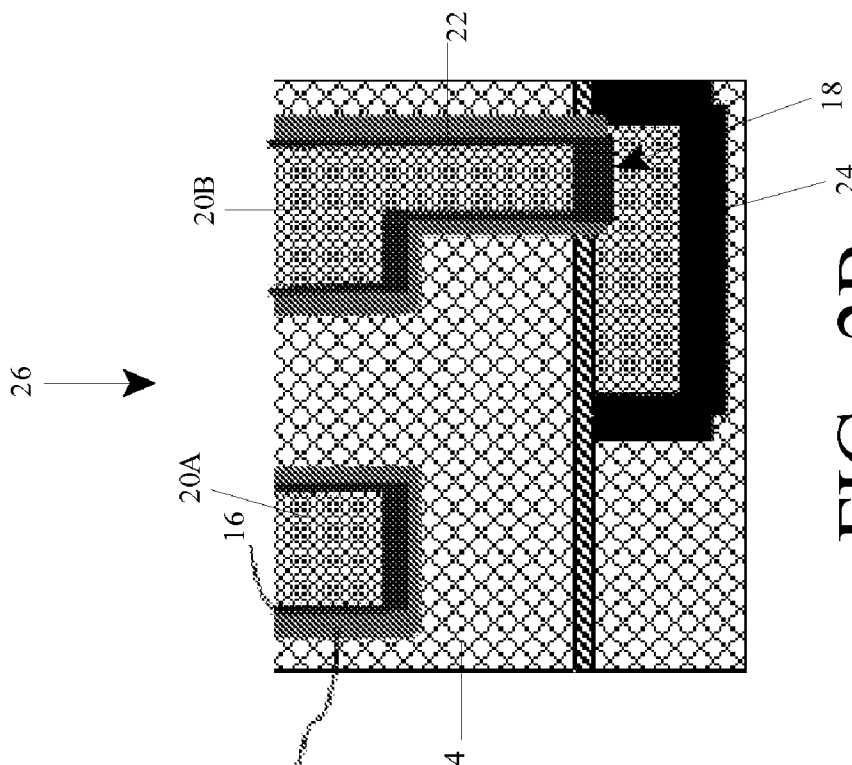
FIGS. 2A-2B show dielectric interconnect structures according to the prior art.
Figure 2A:
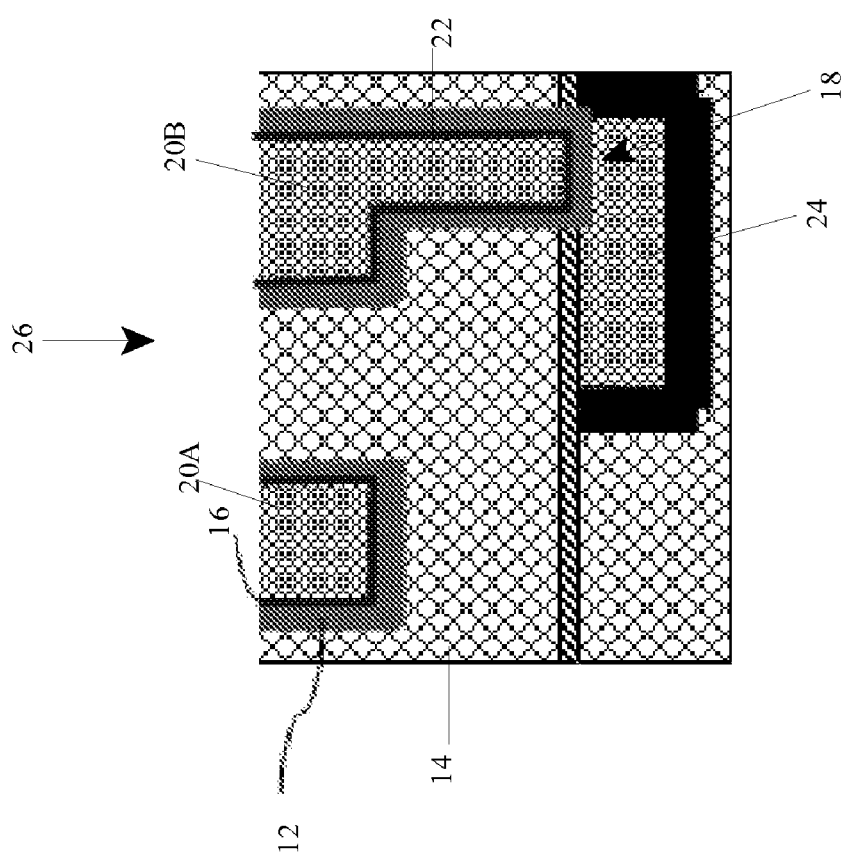

As indicated above, the present invention provides dielectric interconnect structures and methods for forming the same. Specifically, the present invention provides a dielectric interconnect structure having a noble metal layer (e.g., Ru, Ir, Rh, Pt, RuTa, and alloys of Ru, Ir, Rh, Pt, and RuTa) that is formed directly on a modified dielectric surface. In a typical embodiment, the modified dielectric surface is created by treating an exposed dielectric layer of the interconnect structure with a gaseous ion plasma (e.g., Ar, He, Ne, Xe, $N_2$, $H_2$, $NH_3$, and $N_2H_2$). Under the present invention, the noble metal layer could be formed directly on an optional glue layer that is maintained only on vertical surfaces of any trench or via formed in the exposed dielectric layer. In addition, the noble metal layer may or may not be provided along an interface between the via and an internal metal layer.

Referring now to FIGS. 3A-3H, the process steps involved with forming a dielectric interconnect structure according to one embodiment of the present invention are shown. Specifically, referring to FIG. 3A, a post etching process is performed to form at least one trench 42A-42B and at least one via 44 (only one via is shown for illustrative purposes) in an exposed dielectric layer 40 (e.g., $SiO_2$, SiCOH, SiLK, etc.) of dielectric interconnect structure 30. As further shown, exposed dielectric layer 40 is formed on a capping layer 38 (e.g., NBLoK, SiC, $Si_4NH_3$, $SiO_2$, etc.), which itself is formed on an unexposed dielectric layer 32 (e.g., $SiO_2$, SiCOH, SiLK, etc.). In addition, an internal metal layer 36 (e.g., Cu, Al(Cu), etc.) is formed in unexposed dielectric layer 32, and a barrier layer 34 (e.g., Ta(N), Ti(N), Ru, W, etc.) is formed between internal metal layer 36 and unexposed dielectric layer 32.

Figure 3A:
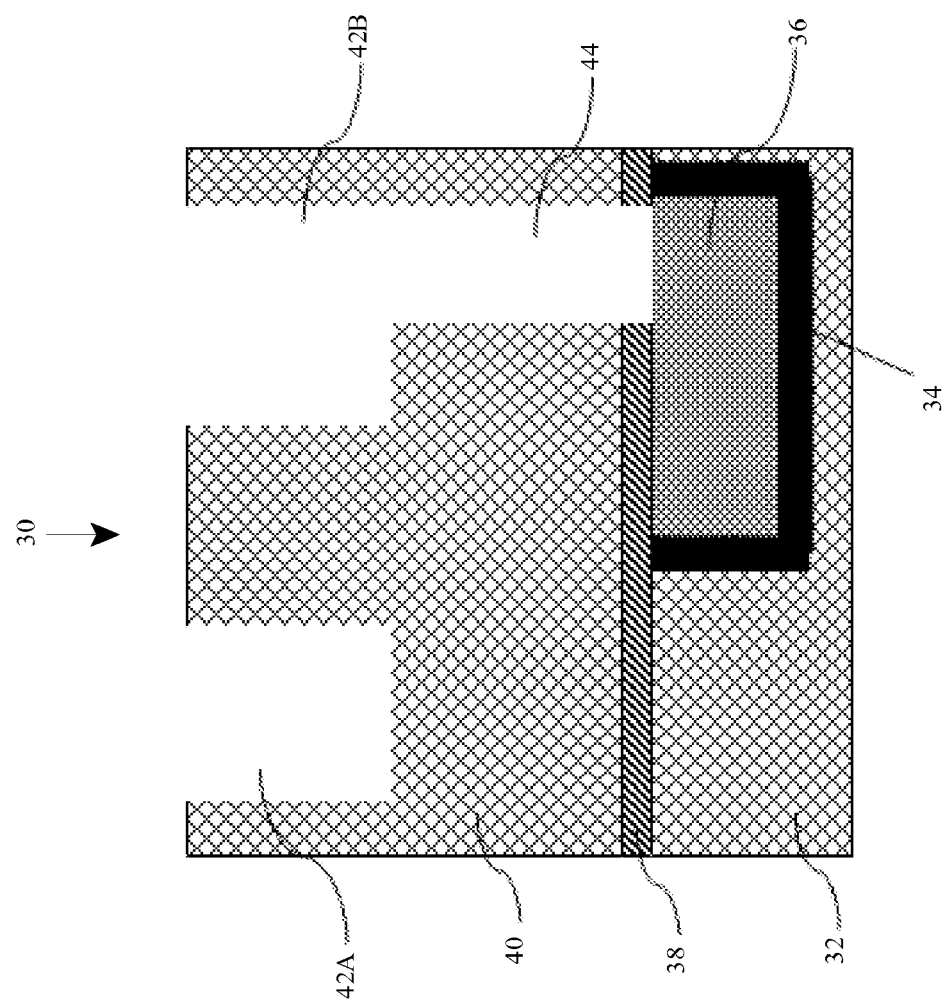
FIGS. 3A-3H show processing steps for forming a dielectric interconnect structure according to one embodiment of the present invention.
Figure 3B:
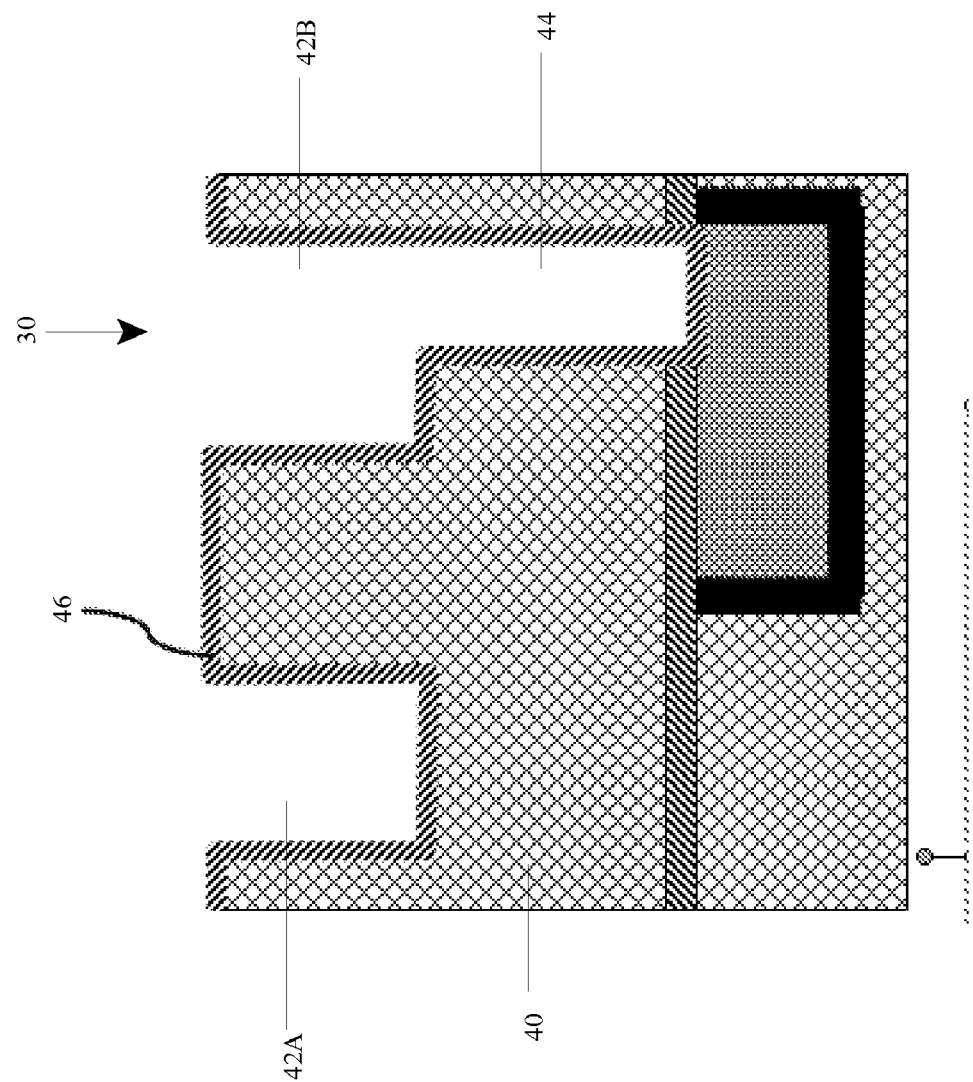
Figure 3C:
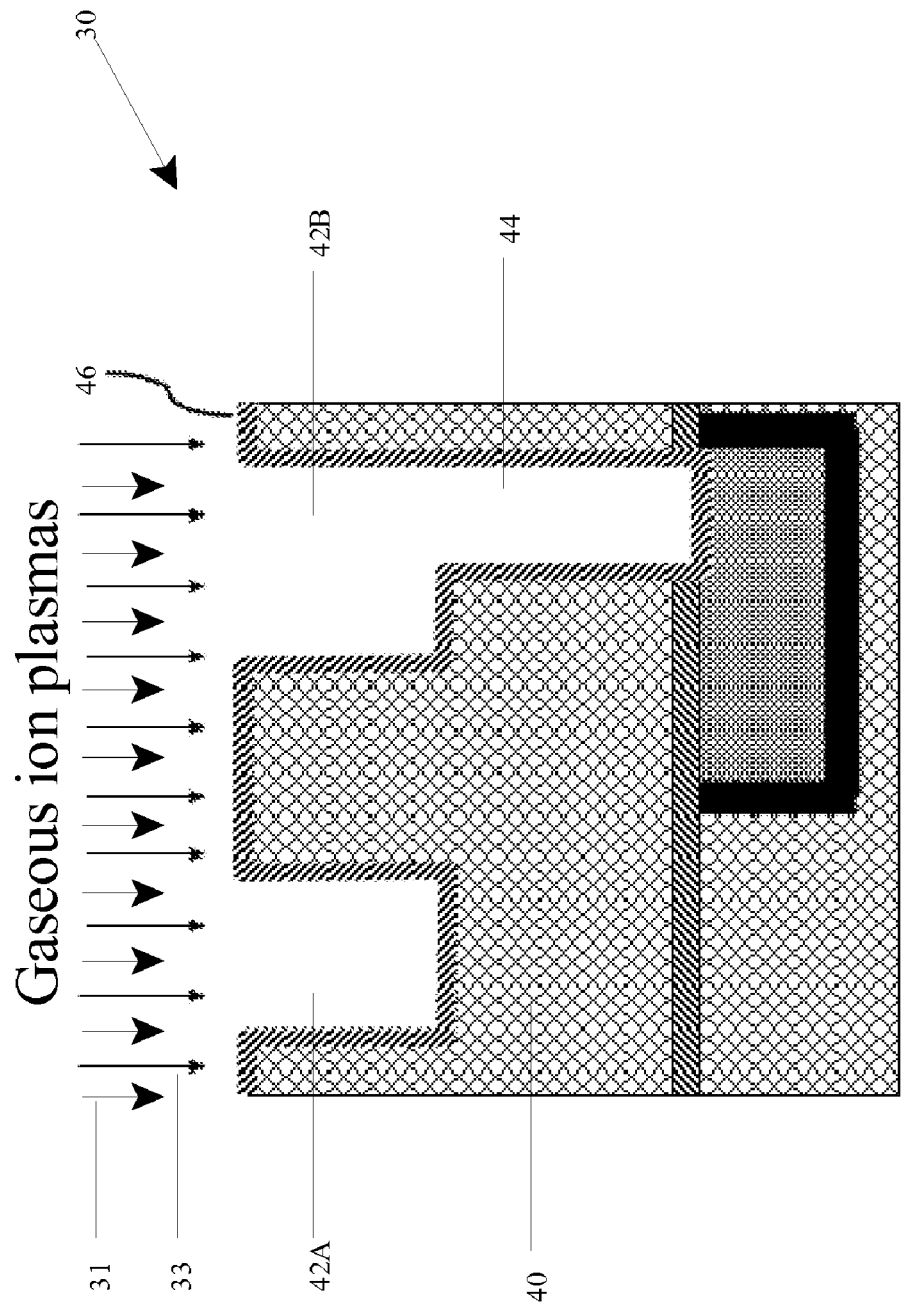

In FIG. 3B, a glue layer 46 (e.g., Ta(N), etc.) is formed (e.g., through deposition) on the outer surface of exposed dielectric layer 40. This includes initially forming glue layer 46 in trenches 42A-42B and via 44. In FIG. 3C, dielectric interconnect structure 30 is treated with a first gaseous ion plasma 31 (e.g., Ar, He, Ne, Xe, etc.) to remove glue layer 46 from any horizontal surfaces of exposed dielectric layer 40, including horizontal surfaces of trenches 42A-42B and via 44. Thereafter, dielectric interconnect structure 30 is treated with another gaseous ion plasma 33 (e.g., Ar, He, Ne, Xe, $N_2$, $H_2$, $NH_3$, and $N_2H_2$, etc) to create a modified dielectric surface.

Figure 3D:
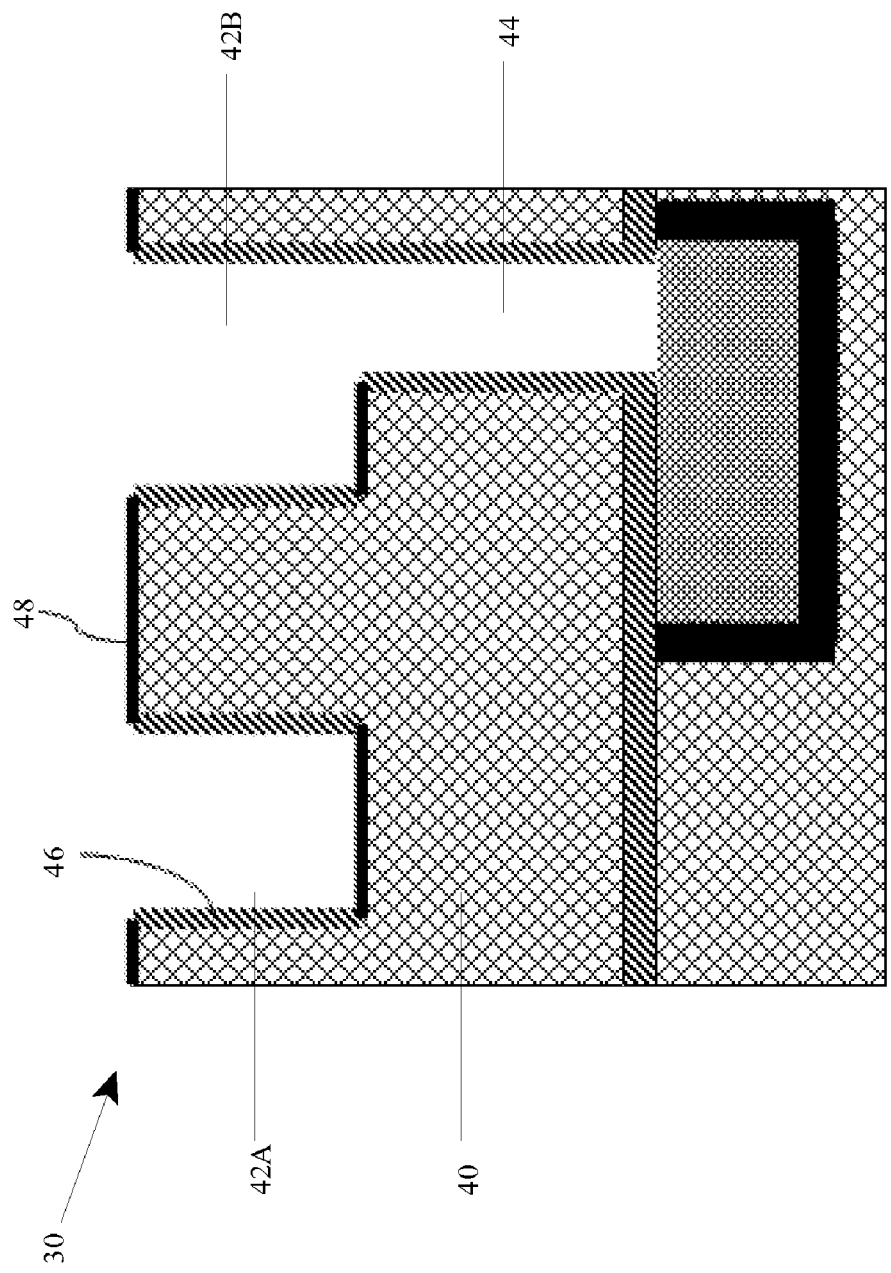
Figure 3E:
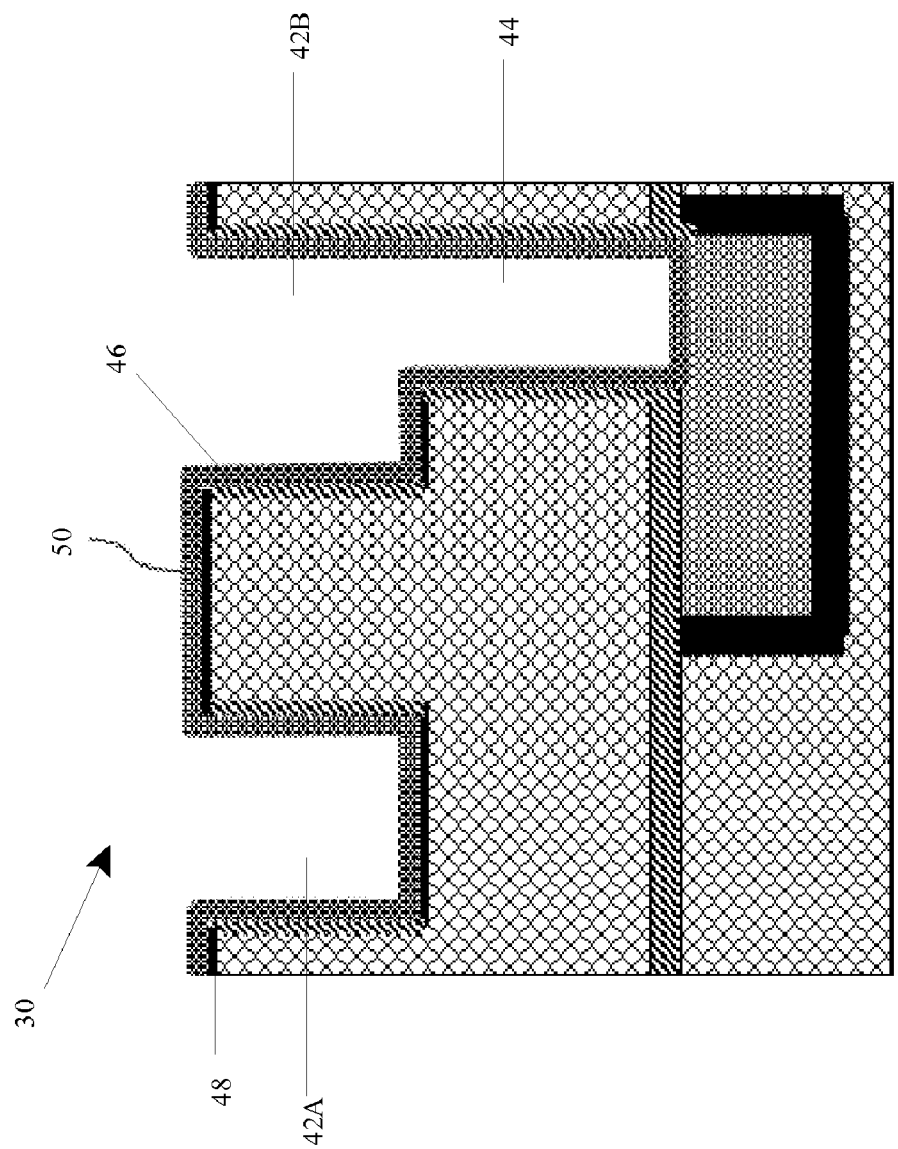

As shown in FIG. 3D, a modified dielectric surface 48 now exists along each horizontal surface of exposed dielectric layer 40 (e.g., wherever glue layer 46 no longer exists). This includes horizontal surfaces of trenches 42A-42B. Referring to FIG. 3E, once modified dielectric surface 48 is formed, a noble metal layer 50 (e.g., Ru, Ir, Rh, Pt, RuTa, alloys thereof, etc.) will be formed (e.g., through deposition) directly on glue layer 46 (i.e., where still existing) and directly on modified dielectric 48. Specifically, as shown in FIG. 3E, noble metal layer 50 is formed all along an outer surface of dielectric interconnect structure 30, including within trenches 42A-42B and via 44. The formation of modified dielectric surface 48 provides improved adhesion between exposed dielectric layer 40 and noble metal layer 50 that was not previously provided. Moreover, unlike previous approaches, the embodiment of FIGS. 3A-3H does not require the use of a glue layer on horizontal surfaces in which the noble metal layer is to be formed.

Figure 3F:
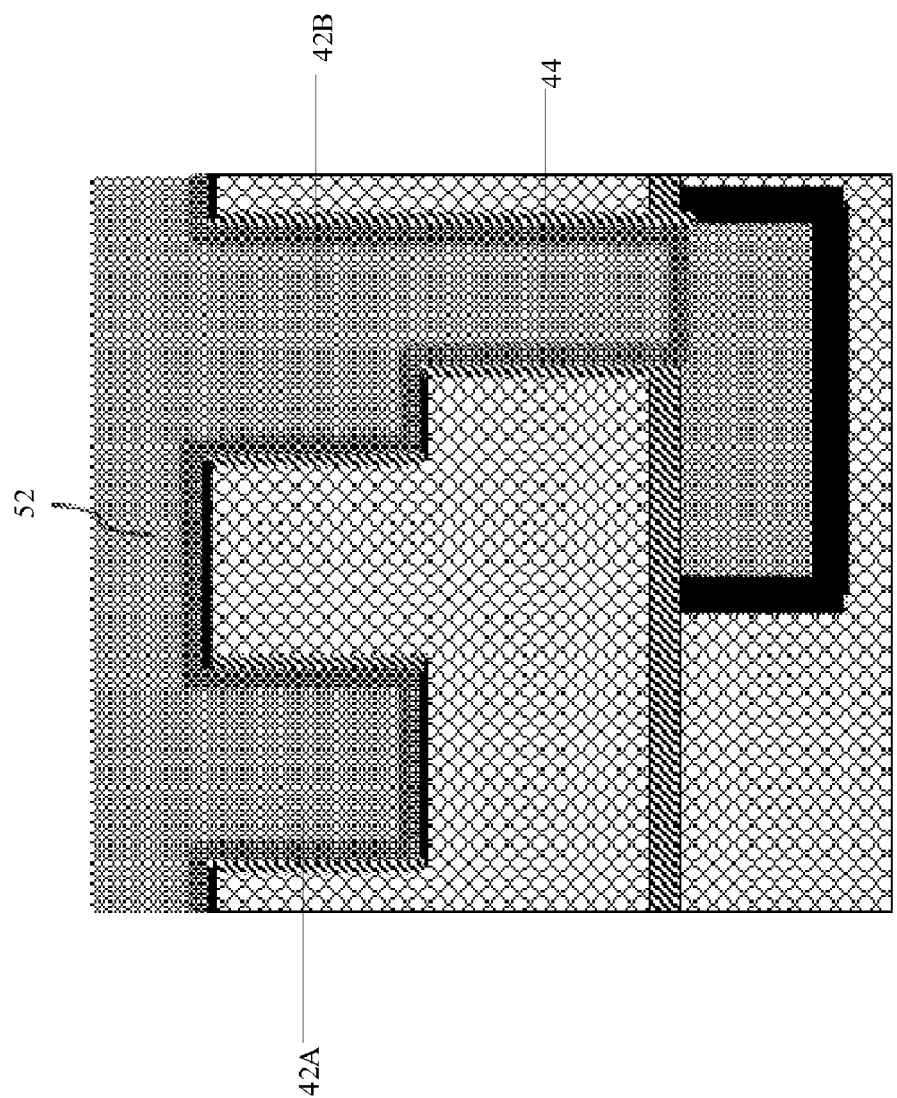
Figure 3G:
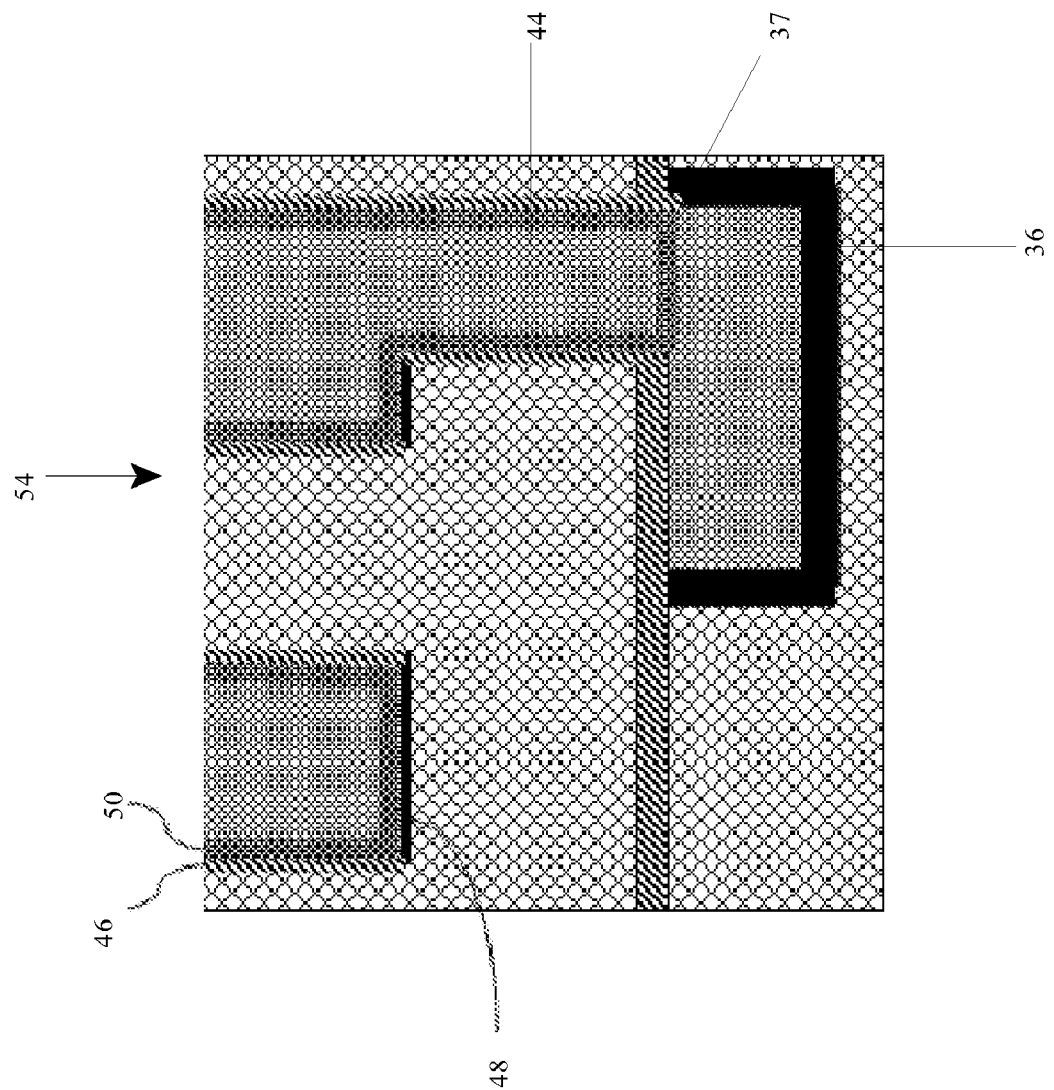

Once noble metal layer 50 has been formed as shown, additional processing steps can be performed such as filling trenches 42A-42B and via 44 with a conductive material 52 (e.g., Cu, Al, etc.) as shown in FIG. 3F, and then performing post CMP as shown in FIG. 3G to yield a finalized dielectric interconnect structure 54. As can be seen in FIG. 3G, dielectric interconnect structure 54 includes a noble metal layer 50 formed directly on glue layer 46 (i.e., where still existing), and directly on modified dielectric layer 48.

Figure 3H:
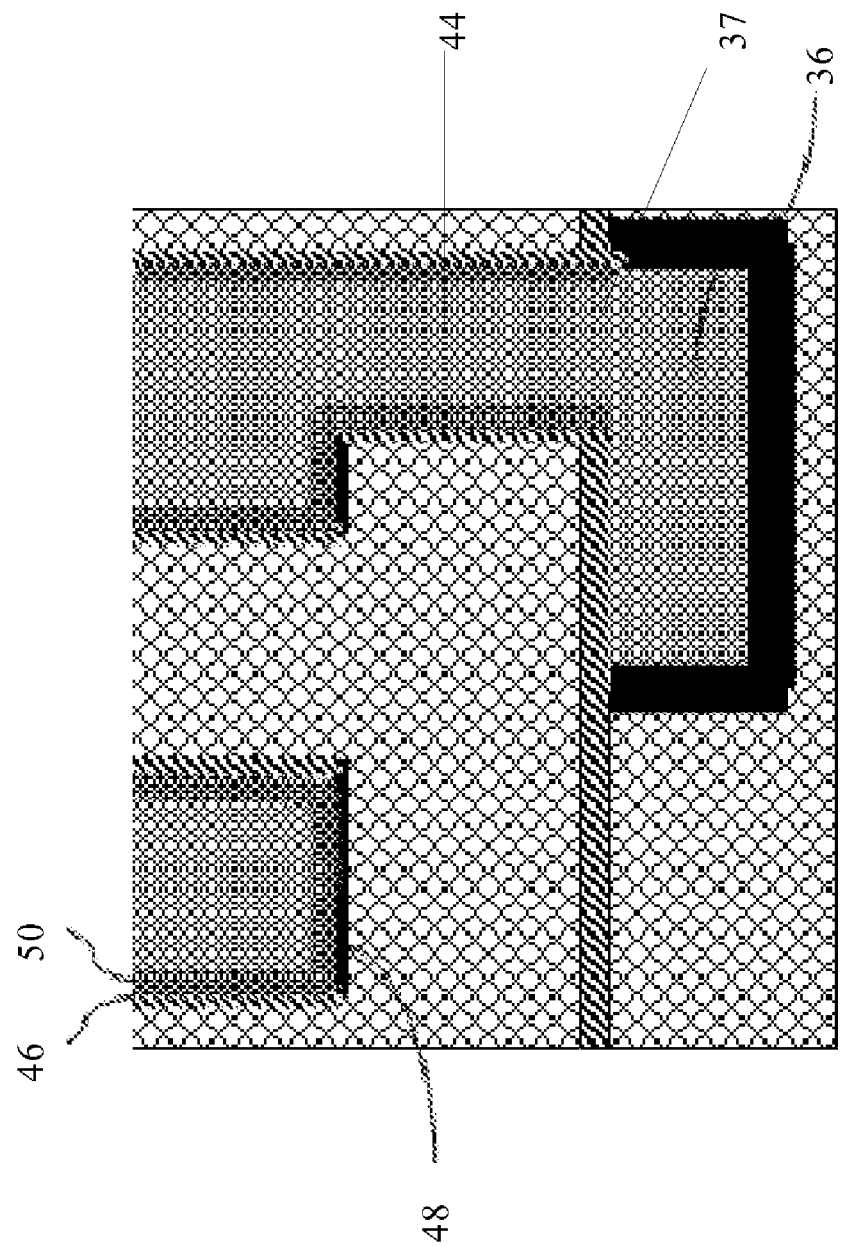

Noble metal layer is also shown in FIG. 3G as being formed along an interface 37 between via 44 and internal metal layer 36. However, this need to be the case. For example, as shown in FIG. 3H, noble metal layer can be lacking (e.g., entirely avoided) along interface 37 between via 44 and internal metal layer 36.

Referring now to FIGS. 4A-4E, the process steps involved with forming a dielectric interconnect structure according to another embodiment of the present invention are shown. As will be shown, the embodiment of FIGS. 4A-4E is similar to that of FIGS. 3A-3H only that glue layer 46 is not formed at all. Specifically, referring to FIG. 4A, a post etching process is performed to form at least one trench 42A-42B and at least one via 44 (only one via is shown for illustrative purposes) in an exposed dielectric layer 40 (e.g., $SiO_2$, SiCOH, SiLK, etc.) of dielectric interconnect structure 30. As further shown, exposed dielectric layer 40 is formed on a capping layer 38 (e.g., NBLoK, SiC, $Si_4NH_3$, $SiO_2$, etc.), which itself is formed on an unexposed dielectric layer 32 (e.g., $SiO_2$, SiCOH, SiLK, etc.). In addition, an internal metal layer 36 (e.g., Cu, Al(Cu), etc.) is formed in unexposed dielectric layer 32, and a barrier layer 34 (e.g., Ta(N), Ti(N), Ru, W, etc.) is formed between internal metal layer 36 and unexposed dielectric layer 32.

Figure 4A:
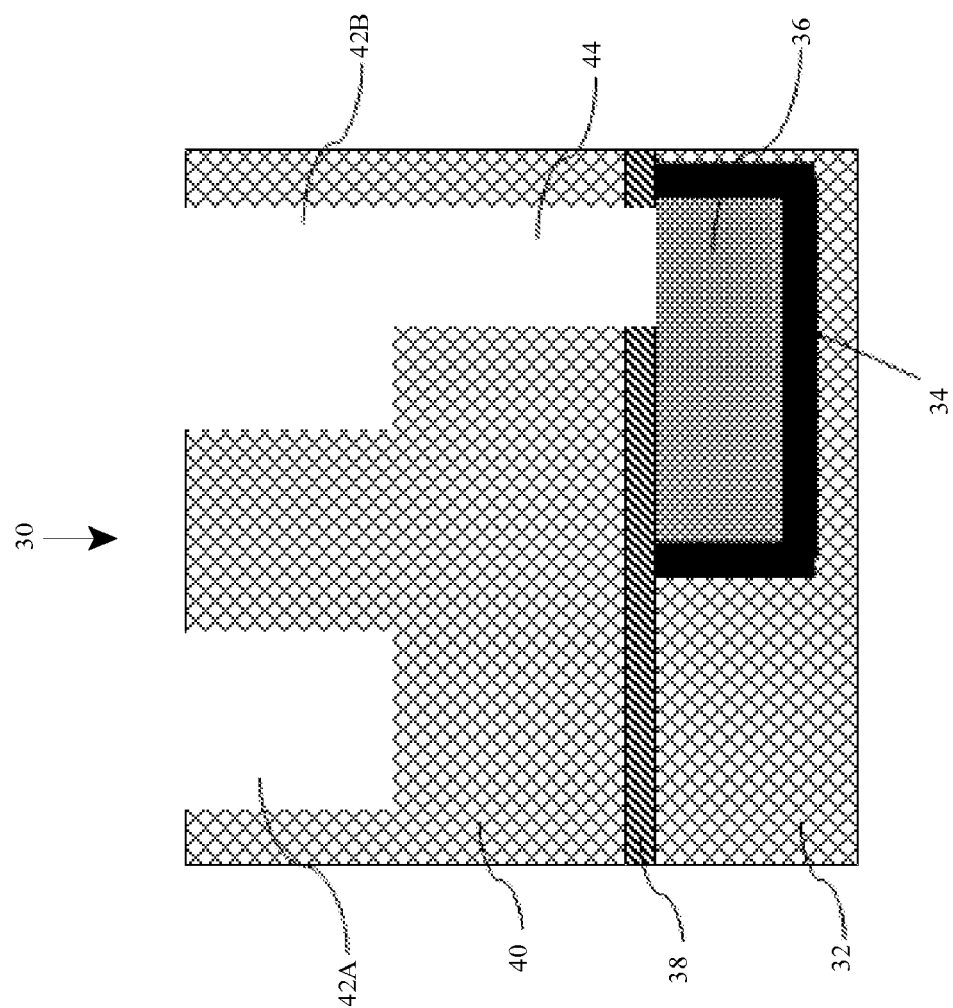
FIGS. 4A-4E show processing steps for forming a dielectric interconnect structure according to another embodiment of the present invention.
Figure 4B:
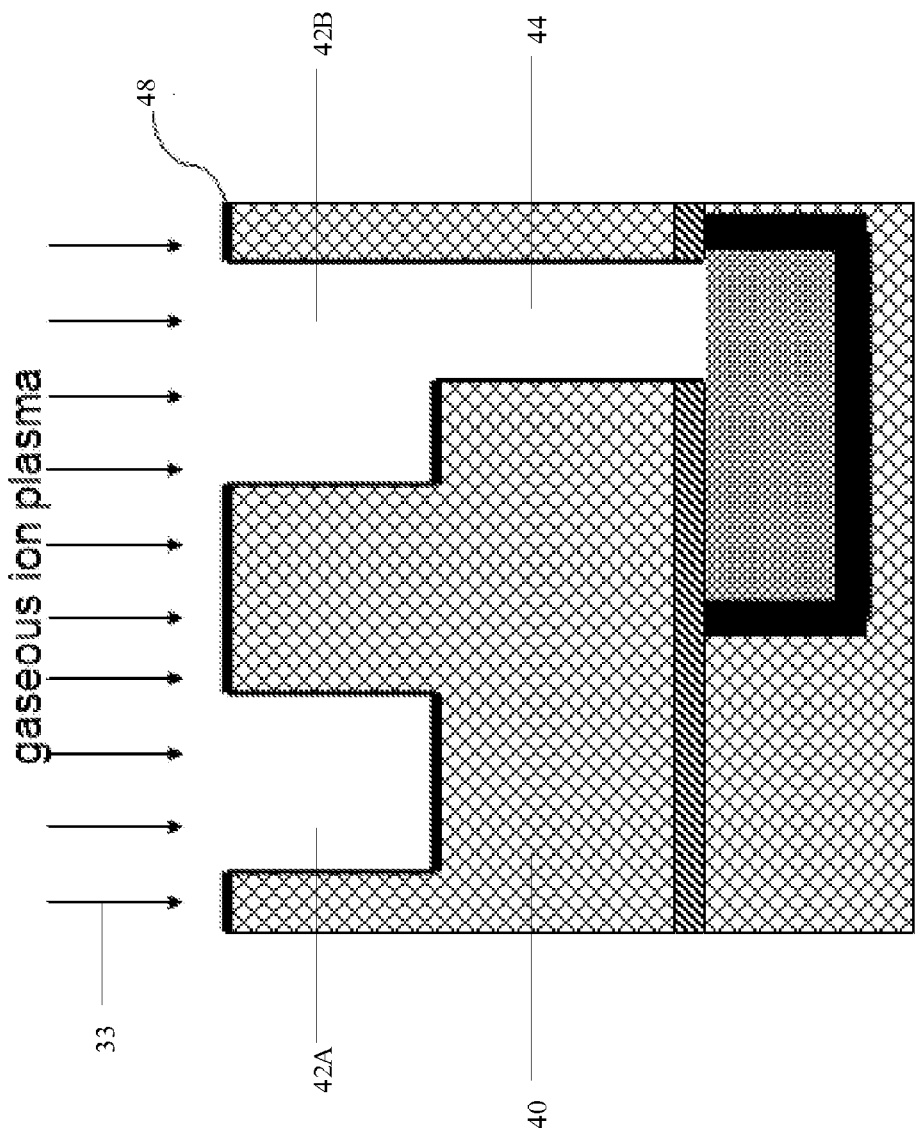

In FIG. 4B, instead of first forming and then selectively removing a glue layer as done for the embodiment of FIGS. 3A-3H, dielectric interconnect structure 30 is treated with gaseous ion plasma 33 (e.g., Ar, He, Ne, Xe, $N_2$, $H_2$, $NH_3$, and $N_2H_2$, etc) to immediately create a modified dielectric surface 48 along all outer surfaces (i.e., on both vertical and horizontal surfaces) of exposed dielectric layer 40, including in trenches 42A-42B and via 44.

Figure 4C:
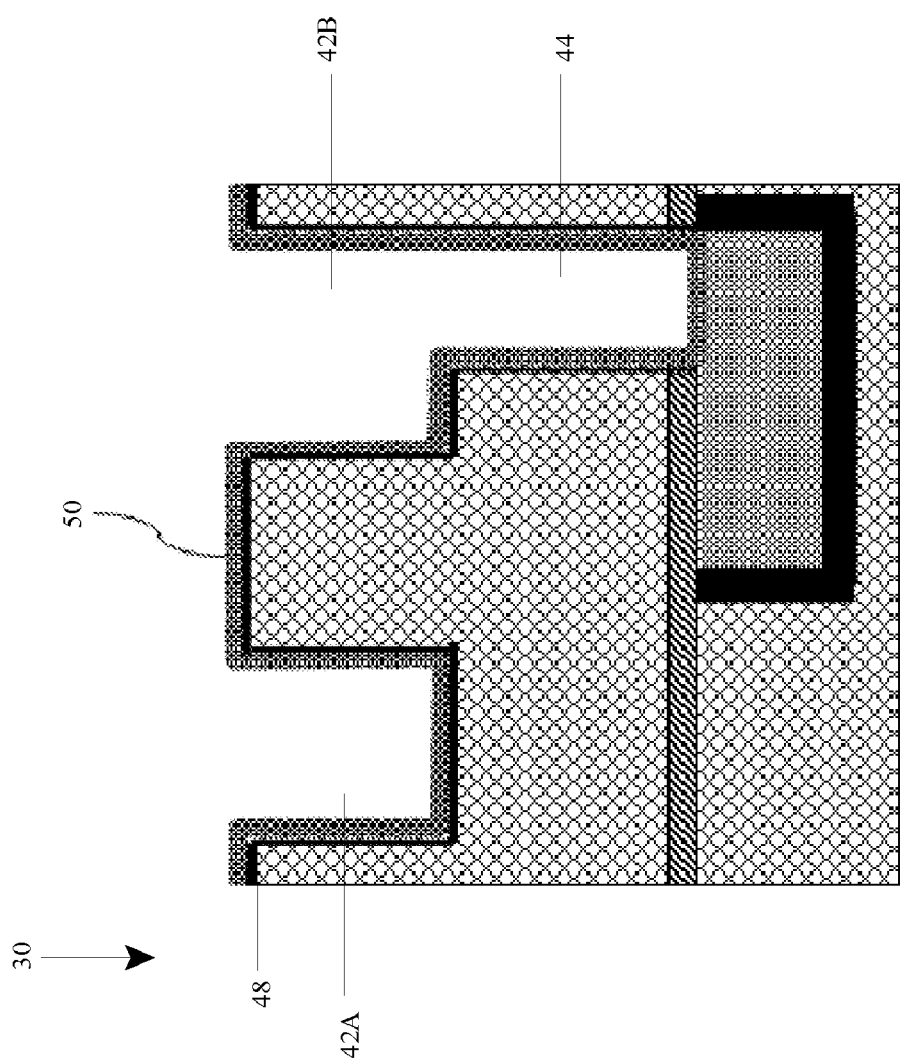

Referring to FIG. 4C, once modified dielectric surface 48 is formed, a noble metal layer 50 (e.g., Ru, Ir, Rh, Pt, RuTa, alloys thereof, etc.) will be formed (e.g., through deposition) directly on modified dielectric 48. Specifically, noble metal layer 50 is formed all along the outer surface of dielectric interconnect structure 30, including within trenches 42A-42B and via 44. As indicated above, the formation of modified dielectric surface 48 provides improved adhesion between exposed dielectric layer 40 and noble metal layer 50 that was not previously provided. Moreover, the embodiment of FIGS. 4A-4E does not require the use of any glue layer (i.e., does not require the use of a glue layer on any or all horizontal and vertical surfaces on which the noble metal layer is to be formed).

Figure 4D:
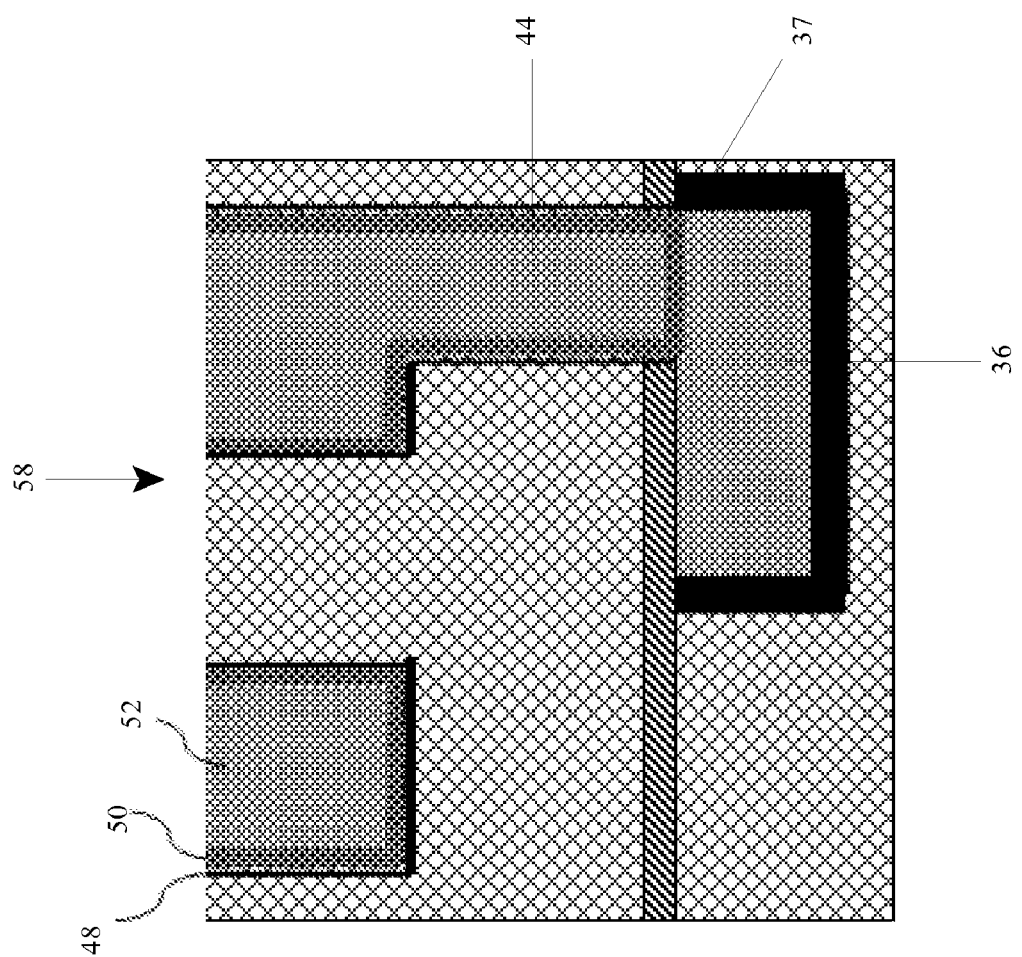
Figure 4E:
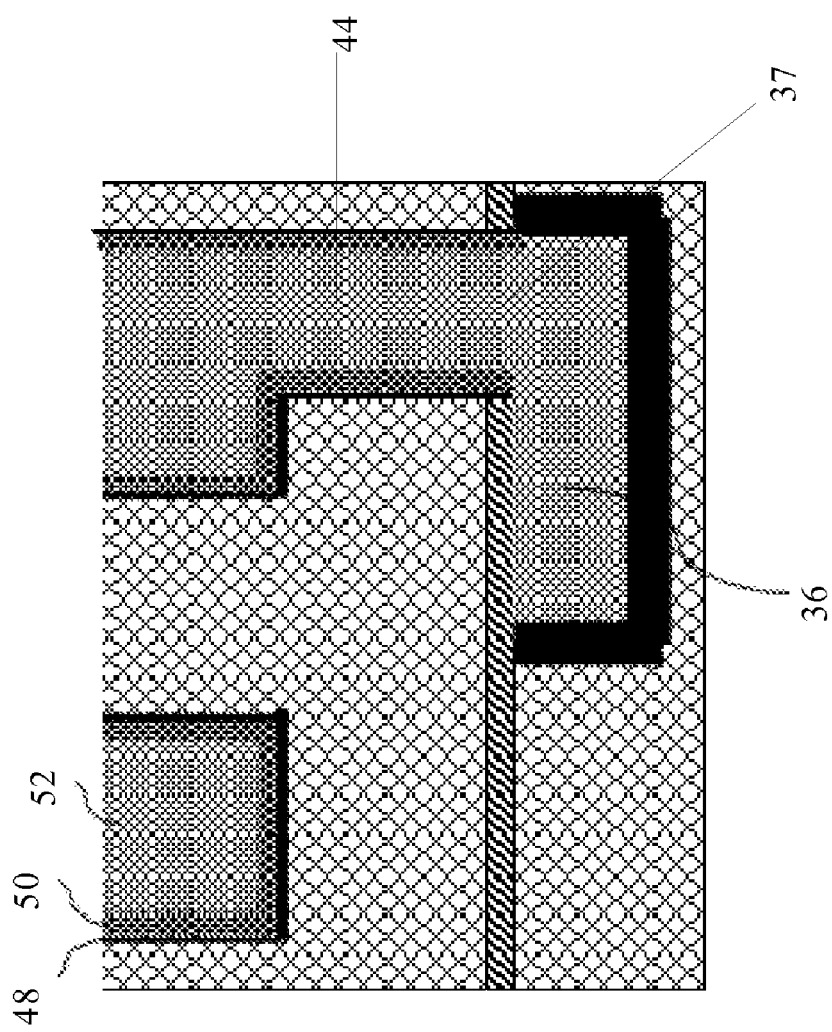

Regardless once noble metal layer 50 has been formed as shown, additional processing steps can be performed such as filling trenches 42A-42B and via 44 with a conductive material 52 (e.g., Cu, Al, etc.), and then performing post CMP to yield a finalized dielectric interconnect structure 58 as shown in FIG. 4D. Although noble metal layer 50 is also shown in FIG. 4D as being formed along an interface 37 between via 44 and internal metal layer 36, this need to be the case. For example, as shown in FIG. 4E, noble metal layer 50 can be lacking (e.g., entirely avoided) along interface 37 between via 44 and internal metal layer 36.

Therefore, the multiple embodiments of the present invention provide at least one dielectric interconnect structure having a modified dielectric surface for providing improved adhesion between a noble metal layer 50 and a dielectric layer 40.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims. For example, the dielectric interconnect structures 54 and 58 are shown including multiple trenches 42A-42B and a single via 44. However, it is understood that dielectric interconnect structures 54 and 58 can include any quantity thereof (e.g., at least one trench and at least one via).

We claim:
1. A dielectric interconnect structure, comprising:
   a dielectric layer;
   at least one trench having at least one sidewall and a horizontal surface;
   a glue layer directly over the at least one sidewall and not extending onto the horizontal surface; and
   a noble metal layer directly over the horizontal surface and contacting the glue layer, wherein the horizontal surface of the noble metal layer only contacts the dielectric layer.

2. The interconnect structure of claim 1, the noble metal layer being selected from a group consisting of Ir, RuTa, and alloys thereof.

3. The interconnect structure of claim 1, the dielectric layer being formed on a capping layer, and the capping layer being formed on an unexposed dielectric layer.

4. The interconnect structure of claim 3, further comprising:
   an internal metal layer formed in the unexposed dielectric layer; and
   a barrier layer formed between the internal metal layer and the unexposed dielectric layer.

5. The dielectric interconnect structure of claim 3, wherein the dielectric layer is a single dielectric layer.

6. The dielectric interconnect structure of claim 4, the noble metal layer lacking along an interface between the at least one trench and the internal metal layer.

7. A dielectric interconnect structure, comprising:
   a dielectric layer having at least one trench and at least one via;
   a glue layer formed only on vertical surfaces of the at least one trench and the at least one via;
   a modified dielectric surface formed only on a horizontal surface of the dielectric layer;
   a noble metal layer deposited directly on the modified dielectric surface and the glue layer, wherein the noble metal layer does not fill the trench, wherein a horizontal surface of the noble metal layer only contacts the modified dielectric layer; and
   a conductive material deposited directly over the noble metal layer and filling the trench.

* * * * *